United States Patent
Cabral, Jr. et al.

(10) Patent No.: US 9,064,727 B2
(45) Date of Patent: Jun. 23, 2015

(54) SPUTTER AND SURFACE MODIFICATION ETCH PROCESSING FOR METAL PATTERNING IN INTEGRATED CIRCUITS

(71) Applicant: International Business Machines Corporation, Armonk, NY (US)

(72) Inventors: Cyril Cabral, Jr., Mahopac, NY (US); Benjamin L. Fletcher, Elmsford, NM (US); Nicholas C. M. Fuller, North Hills, NY (US); Eric A. Joseph, White Plains, NY (US); Hiroyuki Miyazoe, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/970,678

(22) Filed: Aug. 20, 2013

(65) Prior Publication Data
US 2014/0124870 A1     May 8, 2014

Related U.S. Application Data

(63) Continuation of application No. 13/671,186, filed on Nov. 7, 2012, now Pat. No. 8,633,117.

(51) Int. Cl.
*H01L 27/092*     (2006.01)
*H01L 21/3213*     (2006.01)
*H01L 21/768*     (2006.01)

(52) U.S. Cl.
CPC ........ *H01L 27/092* (2013.01); *H01L 21/32131* (2013.01); *H01L 21/32136* (2013.01); *H01L 21/32139* (2013.01); *H01L 21/76885* (2013.01); *H01L 21/76852* (2013.01)

(58) Field of Classification Search
None
See application file for complete search history.

(56) References Cited

U.S. PATENT DOCUMENTS

| 4,557,796 A | 12/1985 | Druschke et al. |
| 4,838,994 A | 6/1989 | Gulde et al. |

(Continued)

FOREIGN PATENT DOCUMENTS

| JP | 6204184 | 7/1994 |
| JP | 6204185 | 7/1994 |

(Continued)

OTHER PUBLICATIONS

"Temperature Effects and Optical Emission Spectroscopy Studies of Hydrogen—Based Plasma Etching of Copper" Fangyu Wu, Galit Levitin and Dennis W. Hess, Journal of Electrochemical Society, 159 (2) pp. H12-H124 (2012).

(Continued)

*Primary Examiner* — Scott B Geyer
(74) *Attorney, Agent, or Firm* — Louis Percello

(57) ABSTRACT

One embodiment of an integrated circuit includes a plurality of semiconductor devices and a plurality of conductive lines connecting the plurality of semiconductor devices, wherein at least some of the plurality of conductive lines have pitches of less than one hundred nanometers and sidewall tapers of between approximately eighty and ninety degrees. Another embodiment of an integrated circuit includes a plurality of semiconductor devices and a plurality of conductive lines connecting the plurality of semiconductor devices, wherein at least some of the plurality of conductive lines are fabricated by providing a layer of conductive metal in a multi-layer structure fabricated upon a wafer and sputter etching the layer of conductive metal using a methanol plasma, wherein a portion of the layer of conductive metal that remains after the sputter etching forms the one or more conductive lines.

19 Claims, 7 Drawing Sheets

(56) References Cited

U.S. PATENT DOCUMENTS

| | | |
|---|---|---|
| 5,318,662 A | 6/1994 | Douglas |
| 5,354,416 A | 10/1994 | Okudaira et al. |
| 5,431,774 A | 7/1995 | Douglas |
| 5,578,166 A | 11/1996 | Hirota |
| 6,010,603 A | 1/2000 | Ye et al. |
| 6,033,986 A * | 3/2000 | Itoh .................. 438/673 |
| 6,103,630 A * | 8/2000 | Lee et al. ............ 438/696 |
| 6,214,423 B1 * | 4/2001 | Lee et al. ............ 427/492 |
| 6,355,979 B2 | 3/2002 | Tesauro et al. |
| 6,498,109 B2 | 12/2002 | Iyer |
| 6,534,416 B1 | 3/2003 | Ye et al. |
| 6,797,640 B2 | 9/2004 | Tesauro et al. |
| 7,994,581 B2 * | 8/2011 | Jeon et al. .......... 257/368 |
| 8,633,117 B1 | 1/2014 | Cabral et al. |
| 2003/0052079 A1 | 3/2003 | Yoshioka et al. |
| 2005/0016957 A1 | 1/2005 | Kodaira et al. |
| 2005/0142844 A1 * | 6/2005 | Ahn ................... 438/622 |
| 2006/0214191 A1 * | 9/2006 | Nishimura .......... 257/208 |
| 2007/0001307 A1 * | 1/2007 | Usui et al. .......... 257/758 |
| 2007/0029643 A1 * | 2/2007 | Johnson et al. ..... 257/651 |
| 2008/0087998 A1 * | 4/2008 | Kamins et al. ..... 257/686 |
| 2009/0197404 A1 | 8/2009 | Yang |
| 2010/0237042 A1 | 9/2010 | Nguyen et al. |
| 2010/0244158 A1 * | 9/2010 | Hu et al. ............ 257/412 |
| 2010/0304504 A1 | 12/2010 | Shinde et al. |
| 2010/0310902 A1 | 12/2010 | Osada et al. |
| 2011/0000880 A1 | 1/2011 | Kamata et al. |
| 2012/0038056 A1 * | 2/2012 | Cabral et al. ....... 257/774 |
| 2012/0049356 A1 * | 3/2012 | Migita et al. ....... 257/737 |
| 2012/0261828 A1 * | 10/2012 | Bruce et al. ........ 257/774 |
| 2013/0009305 A1 * | 1/2013 | Oshida ............... 257/737 |

FOREIGN PATENT DOCUMENTS

| | | |
|---|---|---|
| JP | 6204186 | 7/1994 |
| JP | 7029878 | 1/1995 |

OTHER PUBLICATIONS

"Mechanistic Consideration of Low Temperature Hydrogen-Based Plasma Etching of Cu" Fangyu Wu, Galit Levitin and Dennis W. Hess. School of Chemical and Biomolecular Engineering, Georgia Institute of Technology, 311 Ferst Drive Atlanta, Georgia 30332-0100 published Jan. 2011 pp. 1011013-1-01013-7.

"Low-Temperature Etching of Cu by Hydrogen-Based Plasmas" Fangyu Wu, Galit Levitin and Dennis W. Hess. School of Chemical and Biomolecular Engineering, Georgia Institute of Technology, 311 Ferst Drive Atlanta, Georgia 30332-0100 published on web Jul. 16, 2010 pp. 2175-2179.

"Patterning of Cu Films by a Two-Step Plasma Etching Process at Low Temperature" Fangyu Wu, Galit Levitin and Dennis W. Hess. Journal of Electrochemical Society, 157 (4) pp. H474-H478 (2010).

"Low Temperature Copper Etching Using an Inductively Coupled Plasma with Ultraviolet Light Irradiation" Kang-Sik Choi and Chul-Hi Han. Journal of Electrochemical Society, vol. 145 No. 3 Mar. 1998 pp. L37-L39.

* cited by examiner

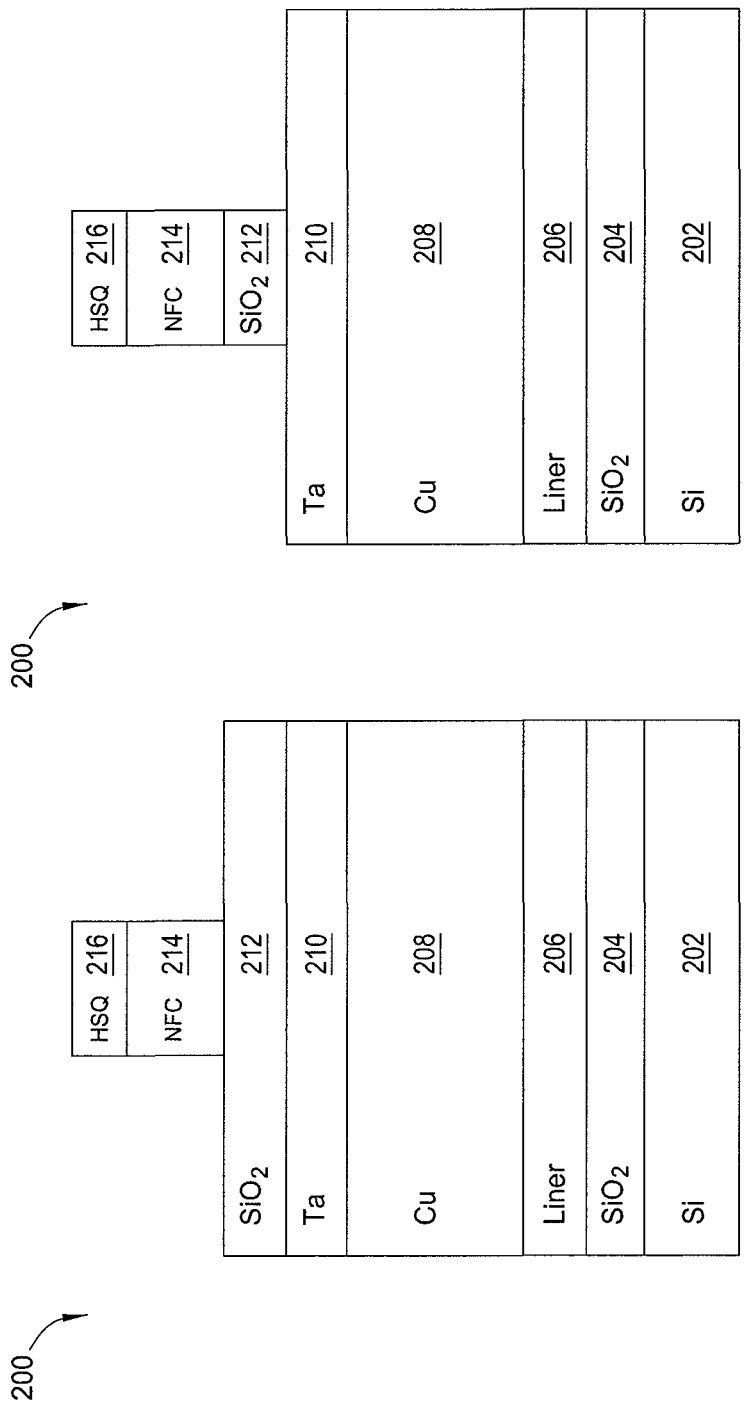

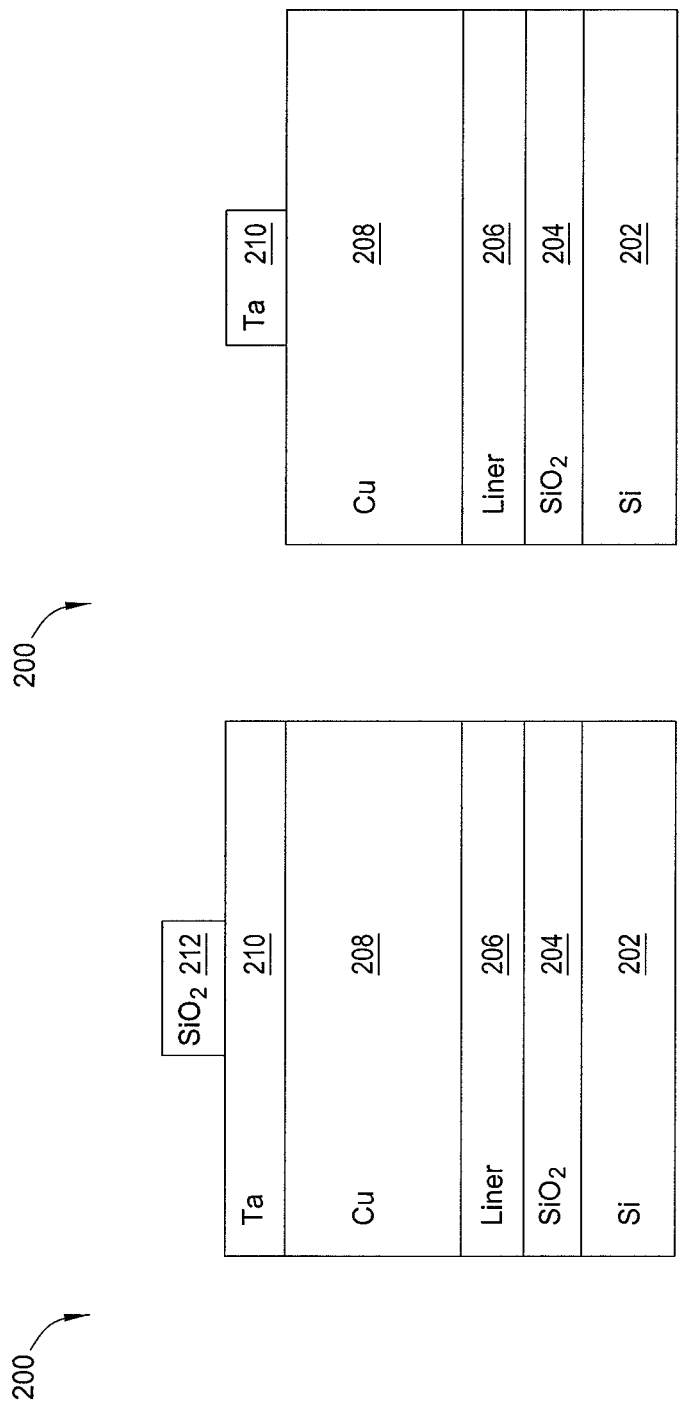

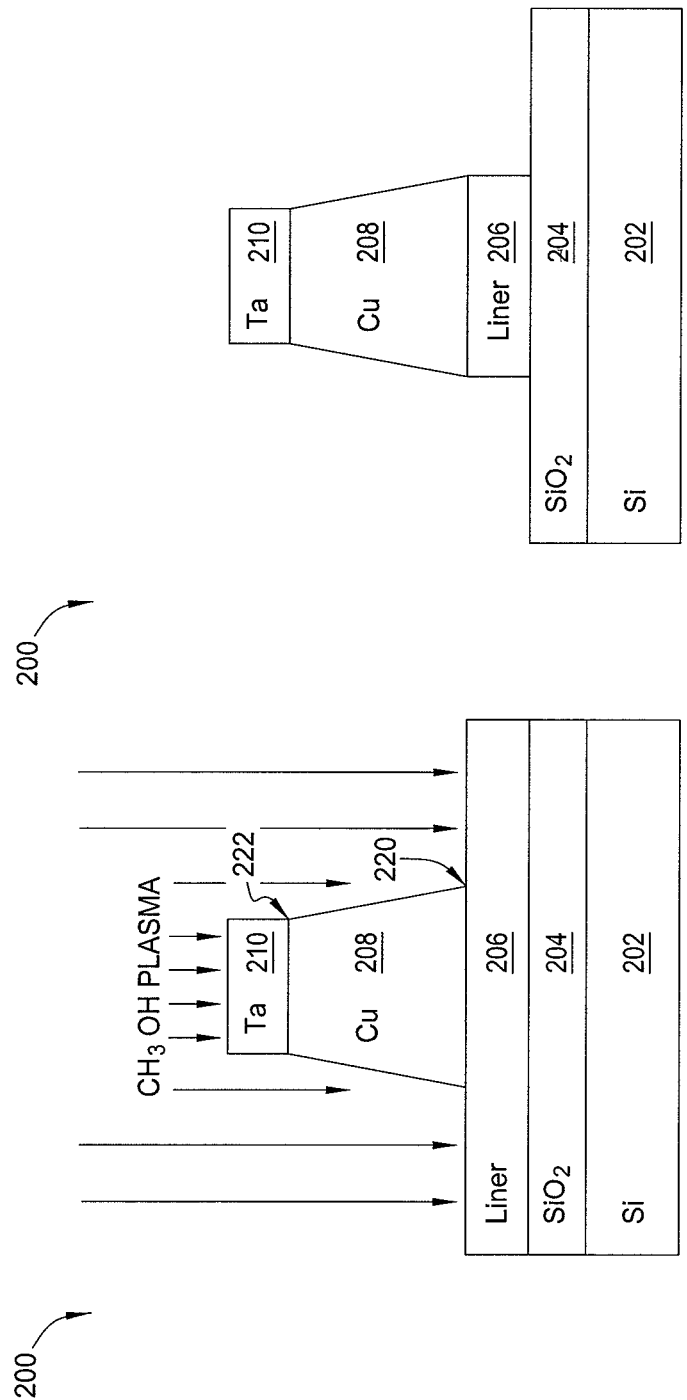

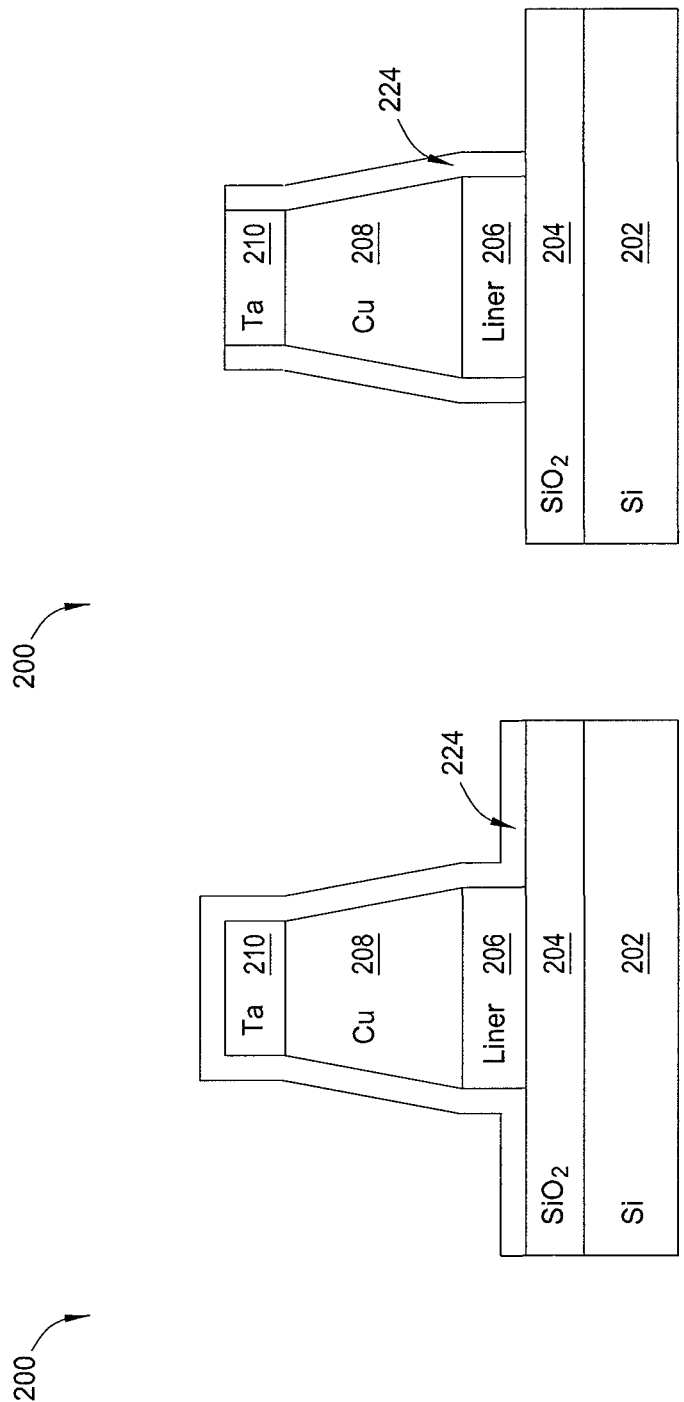

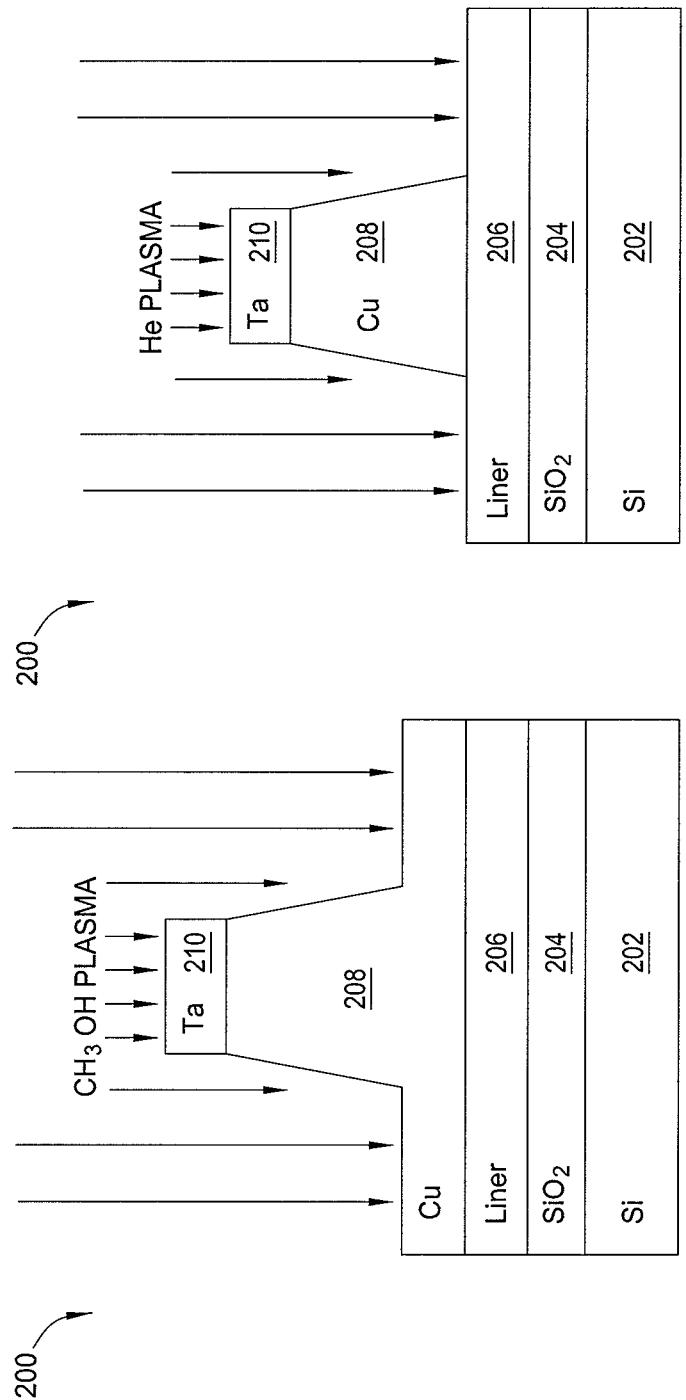

SPUTTER AND SURFACE MODIFICATION ETCH PROCESSING FOR METAL PATTERNING IN INTEGRATED CIRCUITS

CROSS REFERENCE TO RELATED APPLICATIONS

This application is a continuation of U.S. patent application Ser. No. 13/671,186, filed Nov. 7, 2012, which is herein incorporated by reference in its entirety.

BACKGROUND OF THE INVENTION

The present invention relates generally to integrated circuits and relates more specifically to metal patterning processes for use in manufacturing integrated circuits.

Integrated circuits (ICs) commonly use copper interconnects (or "lines") to connect transistors and other semiconductor devices on the ICs. These interconnects are typically fabricated using an additive damascene process in which an underlying insulating layer (e.g., silicon oxide) is patterned with open trenches. FIG. 1, for example, is a schematic diagram illustrating a trench 100 that may be formed in the insulating layer during IC fabrication. A subsequent deposition of copper on the insulating layer fills the trenches with copper. The copper is removed to the top of the insulating layer, but remains within the trenches to form a patterned conductor. Successive layers of insulator and copper are formed according to this damascene process, resulting in a multilayer copper interconnect structure.

Conventional damascene processing such as that described above is not always compatible with the trend toward smaller feature sizes in modern complementary metal-oxide-semiconductor (CMOS) technology. For instance, modern CMOS technology may require lines having widths of less than forty nanometers and aspect ratios (i.e., line height: line width) of approximately 2:1. Attempting conventional damascene processing within these parameters often results in poor liner/seed coverage on the walls of the trenches (e.g., as illustrated at 102 in FIG. 1), pinch off at the mouths of the trenches (e.g., as illustrated at 104), and reentrant reactive ion etching profiles (e.g., as illustrated at 106). Consequently, the copper filling the trenches is subject to voids, defects, and poor adhesion to the trench liners. Moreover, as the lines narrow in size, the resistivity of the copper is increased (due to, for example, the thickness of the liner relative to the thickness of the copper, the small copper grain size, and copper grain boundary and surface scattering phenomena), resulting in decreased IC performance.

SUMMARY OF THE INVENTION

One embodiment of an integrated circuit includes a plurality of semiconductor devices and a plurality of conductive lines connecting the plurality of semiconductor devices, wherein at least some of the plurality of conductive lines have pitches of less than one hundred nanometers and sidewall tapers of between approximately eighty and ninety degrees.

Another embodiment of an integrated circuit includes a plurality of semiconductor devices and a plurality of conductive lines connecting the plurality of semiconductor devices, wherein at least some of the plurality of conductive lines are fabricated by providing a layer of conductive metal in a multilayer structure fabricated upon a wafer and sputter etching the layer of conductive metal using a methanol plasma, wherein a portion of the layer of conductive metal that remains after the sputter etching forms the one or more conductive lines.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2I are schematic diagrams illustrating various stages of fabrication of a complementary metal-oxide-semiconductor device, according to embodiments of the present invention; and FIGS. 3A-3B are schematic diagrams illustrating a two-step plasma sputter etch process, according to an alternative embodiment of the present invention.

DETAILED DESCRIPTION

Figure 1:
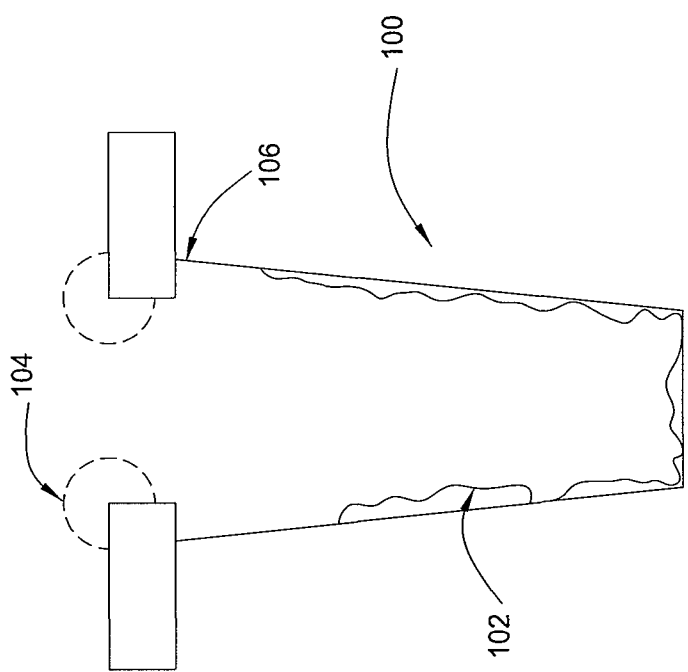
FIG. 1 is a schematic diagram illustrating a trench that may be formed during integrated circuit fabrication.

In one embodiment, the invention is a method and apparatus for metal patterning using a sputter etch process. Embodiments of the invention pattern fine metal lines on an insulating layer of an integrated circuit via a subtractive process (i.e., a process that creates a desired structure by removing material rather than by adding material). In a particular embodiment, the subtractive process uses methanol etch chemistry. The methanol etch process may comprise a single-step process including only a methanol plasma etch, or a two-step process including methanol plasma etch followed by a second plasma etch using a different plasma chemistry. The disclosed process maximizes metal grain growth and minimizes metal resistivity. In addition, the disclosed process allows for flexibility in the choice of materials used for trench liners and minimizes low-k/ultra-low-k damage phenomena due to hard mask stripping and chemical mechanical polishing.

FIGS. 2A-2I are schematic diagrams illustrating various stages of fabrication of a complementary metal-oxide-semiconductor (CMOS) device 200, according to embodiments of the present invention. As such, FIGS. 2A-2I also collectively serve as a flow diagram illustrating portions of one embodiment of a method for fabricating the CMOS device 200, according to the present invention.

In particular, FIG. 2A illustrates the CMOS device 200 at an intermediate stage in the processing. For the purpose of clarity, several fabrication steps leading up to the production of the CMOS device 200 as illustrated in FIG. 2A are omitted. In other words, the CMOS device 200 does not start out in the form illustrated in FIG. 2A, but may develop into the illustrated structure over several well-known processing steps which are not illustrated but are well-known to those of skill in the art.

The CMOS device 200 generally comprises a plurality of layers at this intermediate stage in the processing, including: a silicon wafer 202, a first dielectric layer 204 (e.g., comprising silicon dioxide ($SiO_2$), silicon nitride ($Si_3N_4$), silicon oxynitride (SiON), or a low-k dielectric) formed on the silicon wafer 202, a first liner layer 206 (e.g., comprising tantalum (Ta), tantalum nitride (TaN), cobalt (Co), manganese (Mn), manganese oxides (MnOx), or manganese silicates ($MnSixOy$)) formed on the first dielectric layer 204, a conductive metal layer 208 (e.g., comprising copper (Cu), a copper alloy, gold (Au), nickel (Ni), cobalt (Co), or any other material that does not readily form a volatile species) formed on the first liner layer 206, a first hard mask layer 210 (e.g., comprising tantalum (Ta), niobium (Nb), or vanadium (V)) formed on the conductive metal layer 208, a second hard mask layer 212 (e.g., comprising $SiO_2$ or $Si_3N_4$) formed on the first hard mask layer 210, an organic underlayer 214 (e.g., comprising near frictionless carbon (NFC) or an organic planarizing layer (OPL)) formed on the second hard mask layer 212, and a photoresist or electron beam resist layer 216 (e.g., comprising hydrogen silsesquioxane (HSQ)) formed on the organic underlayer 214.

FIG. 2A illustrates the CMOS device 200 after a pattern of very small structures has been formed in the organic underlayer 214 and photoresist layer 216. In one embodiment, the organic underlayer 214 and photoresist layer 216 are patterned using a photolithography technique, such as optical lithography or direct write electron beam lithography. In one embodiment, the photolithography technique includes a negative resist that allows removal of the organic underlayer 214 and photoresist layer 216 down to the second hard mask layer 212, except for the portions of the organic underlayer 214 and photoresist layer 216 illustrated in FIG. 2A.

As illustrated in FIG. 2B, the pattern is transferred from the organic underlayer 214 and photoresist layer 216 to the second hard mask layer 212. In one embodiment, pattern transfer involves etching the second hard mask layer 212 down to the first hard mask layer 210 (e.g., using a dry etch process such as reactive ion etching). Pattern transfer results in portions of the second hard mask layer 212 being removed. For instance, in the embodiment illustrated in FIG. 2B, all portions of the second hard mask layer 212 except for the portions residing directly beneath the organic underlayer 214 and photoresist layer 216 are removed down to the first hard mask layer 210.

As illustrated in FIG. 2C, the organic underlayer 214 and photoresist layer 216 are next removed down to the second hard mask layer 212, leaving the patterned second hard mask layer 212. As illustrated in FIG. 2D, the pattern is next transferred from the second hard mask layer 212 to the first hard mask layer 210. In one embodiment, the pattern transfer from the second hard mask layer 212 to the first hard mask layer 210 is accomplished in a manner similar to that described above (e.g., etching followed by removal of second hard mask material). In the embodiment illustrated in FIG. 2D, the pattern transfer results in the first hard mask layer 210 being etched down to the conductive metal layer 208, except for the portions of the first hard mask layer 210 residing directly beneath the second hard mask layer 212.

As illustrated in FIG. 2E, an etch process is next used to remove a portion of the conductive metal layer 208. In one embodiment, a methanol ($CH_3OH$) plasma sputter etch process is used to remove the portions of the conductive metal layer 208. The process illustrated in FIG. 2E comprises a single etch step using methanol plasma. However, in an alternative embodiment illustrated in FIGS. 3A-3B and described in greater detail below, the etch process comprises two etch steps using two different plasma chemistries. In the embodiment illustrated in FIG. 2E, the conductive metal layer 208 is etched down to the first liner layer 206, except for the portions of the conductive metal layer 208 residing directly beneath the first hard mask layer 210. The remaining portions of the conductive metal layer 208 form one or more thin metal lines or interconnects. In one embodiment, each line has a shape in which the base 220 of the line is wider than the top 222 of the line (for instance, the base may be twice as wide as the top). Thus, each line may have a substantially pyramidal profile (having, for example, a sidewall taper of approximately eighty to ninety degrees). In a further embodiment, the height of each line is greater than the width of the line at its widest point (e.g., at least twenty percent greater than the width of the base).

As illustrated in FIG. 2F, an etch process is used to remove a portion of the first liner layer 206. In the embodiment illustrated in FIG. 2F, the first liner layer 206 is etched down to the first dielectric layer 204, except for the portions of the first liner layer 206 residing directly beneath the conductive metal layer 208. The remaining portions of the first liner layer 206 form the bases of the "trenches" that immediately surround the conductive metal layer 208.

As illustrated in FIG. 2G, the sidewalls of the liners are formed by first depositing a second liner layer 224 (e.g., comprising TaN) over the CMOS device 200. The second liner layer 224 coats portions of the first dielectric layer 204, the first liner layer 206, the conductive metal layer 208, and the first hard mask layer 210. In one embodiment, the second liner layer 224 is deposited by atomic layer deposition.

As illustrated in FIG. 2H, a portion of the second liner layer 224 is next removed. In one embodiment, at least the portion of the second liner layer 224 that coats the first dielectric layer 204 and the top of the first hard mask layer 210 is removed; the portions of the second liner layer 224 coating the first liner layer 206, the conductive metal layer 208, and the sides of the first hard mask layer 210 remain intact. In one embodiment, the portions of the second liner layer 224 are removed via an etch process, such as reactive ion etching.

Figure 2I:
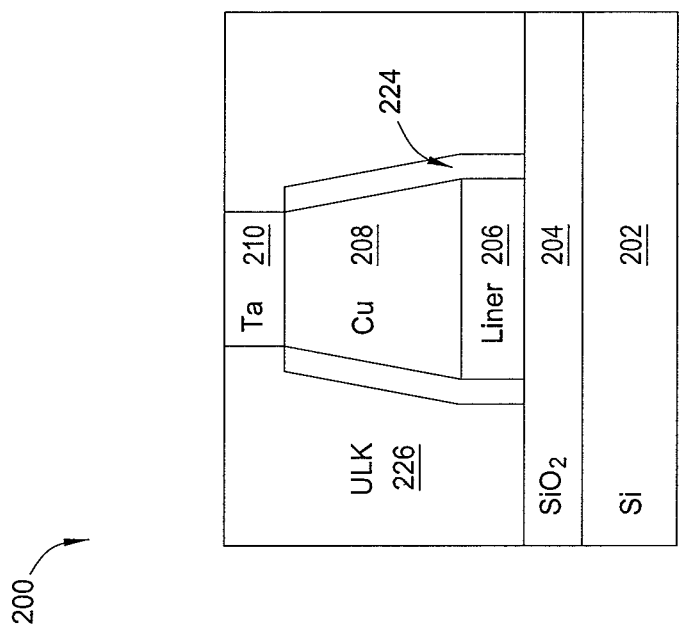

As illustrated in FIG. 2I, a second dielectric layer 226 (e.g., comprising a low-k dielectric material for which k<approximately 4.0) is next deposited over the CMOS device 200 and planarized. Specifically, the second dielectric layer 226 fills in the empty space in the CMOS device 200, coating portions of the first dielectric layer 204, the first liner layer 206, the second liner later 224, and the first hard mask layer 210. The resultant structure thus includes one or more trenches (i.e., the interior volumes defined by the first liner layer 206 and the second liner layer 224, which collectively form a conformal liner for the trenches) containing fine metal lines (i.e., the conductive material layer 208).

The present invention thus enables the fabrication of CMOS devices having small features sizes (e.g., lines widths of less than forty nanometers and/or pitches of less than one hundred nanometers). The resultant CMOS device 200 is fabricated with minimal damage to the ultra-low-k dielectric material and trenches, which are substantially free of voids and defects. The process also results in maximized grain growth and minimized resistivity in the interconnects of the CMOS device 200. Furthermore, the use of methanol to etch the interconnects minimizes the surface roughening effect on the surface of the metal as compared to conventional damascene processes, thereby better maintaining the metal's conductivity.

As discussed above, the methanol plasma etch process that is used to remove portions of the conductive metal layer 208 can comprise either a single etch step using methanol plasma (as illustrated in FIG. 2E) or two etch steps using two different plasma chemistries. FIGS. 3A-3B are schematic diagrams illustrating a two-step plasma sputter etch process, according to an alternative embodiment of the present invention. As such, FIGS. 3A-3B also collectively serve as a flow diagram illustrating the steps of this alternative embodiment.

As illustrated in FIG. 3A, a first sputter etch step is performed using methanol plasma. This can be achieved using any plasma system used for semiconductor device prototyping or fabrication. For instance, medium to high density (i.e., plasma densities>approximately $10^8$ cm$^{-3}$) and low electron temperature $T_e$ (i.e., $T_e$<approximately 10 eV) systems can be used; however, a high source density and low ion energy system will typically be used. Such systems include, but are not limited to: inductively coupled plasma (ICP) systems, electron cyclotron resonance (ECR) systems, helicon systems, dual frequency capacitive (DFC) systems, helical resonator systems, and microwave-generated discharge systems. Additionally, low ion energies are characterized by any of the above-described systems in which radio frequency (RF) power is coupled to the platen/substrate using frequencies less than approximately 100 MHz and power less than approximately 2000 W.

The first etch step removes a first portion of the exposed conductive metal layer 208 (i.e., the portion of the conductive metal layer 208 not residing directly beneath the first hard mask layer 210). In one embodiment, the first sputter etch step removes the conductive metal layer 208 at a first etch rate (e.g., approximately one hundred nanometers per minute).

As illustrated in FIG. 3B, a second sputter etch step is performed using a second plasma chemistry. In one embodiment, the second plasma chemistry is a pure helium (He) plasma. Alternatively, this discharge can comprise any chemically inert gas with a high ultraviolet/vacuum ultraviolet (UV/VUV) emissivity, including, but not limited to: krypton (Kr), argon (Ar), xenon (Xe), hydrogen plasma (H$_2$), or combinations thereof, operating under low ion energy conditions as described above. The second sputter etch/metal surface modification step removes a second portion of the exposed conductive metal layer 208 (i.e., what remains of the exposed conductive metal layer 208 after the first etch step illustrated in FIG. 3A). In one embodiment, the second sputter etch step removes the conductive metal layer 208 at a second etch rate that is lower than the first etch rate (e.g., approximately ten nanometers per minute). Thus, after the two-step plasma etch process, the exposed portions of the conductive metal layer 208 are etched down to the first liner layer 206.

The second sputter/metal surface modification etch step provides a soft landing for the etch of the conductive metal layer 208. Helium plasma is a good process plasma to use in the second etch step because its characteristics (e.g., lighter ion mass and high VUV emissions compared to other plasma gases) result in increased etch selectivity to the organic materials in the CMOS device 200 (e.g., the photoresist layer 216, underlayers such as the organic underlayer 214, and low-k/ultra-low-k dielectric materials). In particular, the high VUV emissions (e.g., approximately twenty electronvolts at a wavelength of around sixty nanometers) can increase the etch resistances of the organic/inorganic and low-k/ultra-low-k dielectric materials and allow these materials to be cured (typically through increased cross linking and/or elimination of reactive dangling bonds). This controls the roughness of the metal lines. The lighter ion mass of the helium increases the etch selectivity against materials not being removed, leads to less damage to low-k/ultra-low-k dielectric materials, and improves the time-dependent dielectric breakdown.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. An integrated circuit, comprising:
    a plurality of semiconductor devices;
    a plurality of conductive lines connecting the plurality of semiconductor devices, wherein at least some of the plurality of conductive lines have pitches of less than one hundred nanometers, and wherein at least some of the conductive lines are formed from a methanol plasma-etched metal; and
    a plurality of liners each comprising two sections, wherein a first section of each of the plurality of liners is positioned directly between a respective one of the plurality of conductive lines and a layer of dielectric material, and wherein a second section of each of the plurality of liners comprises a portion that contacts a portion of the first section of each of the plurality of liners and also at least partially surrounds one of the plurality of conductive lines.

2. The integrated circuit of claim 1, wherein at least one liner of the set of liners is in direct contact with a base of a respective one of the plurality of conductive lines.

3. The integrated circuit of claim 2, wherein at least one liner of the set of liners is in direct contact with a sidewall of the respective one of the plurality of conductive lines.

4. The integrated circuit of claim 1, wherein at least some of the plurality of conductive lines have sidewall tapers of between approximately eighty and ninety degrees.

5. The integrated circuit of claim 1, wherein at least some of the plurality of conductive lines have line widths of less than forty nanometers.

6. The integrated circuit of claim 1, wherein at least some of the plurality of conductive lines have substantially pyramidal profiles.

7. The integrated circuit of claim 6, wherein the substantially pyramidal profiles are defined by sidewalls having a taper of approximately eighty degrees.

8. The integrated circuit of claim 1, wherein at least some of the plurality of conductive lines comprise copper.

9. The integrated circuit of claim 1, wherein at least some of the plurality of conductive lines comprise a copper alloy.

10. The integrated circuit of claim 1, wherein at least some of the plurality of conductive lines comprise gold.

11. The integrated circuit of claim 1, wherein at least some of the plurality of conductive lines comprise nickel.

12. The integrated circuit of claim 1, wherein at least some of the plurality of conductive lines comprise cobalt.

13. The integrated circuit of claim 1, wherein the integrated circuit comprises a complementary metal-oxide-semiconductor device.

14. The integrated circuit of claim 1, wherein at least some of the plurality of liners comprise tantalum.

15. The integrated circuit of claim 1, wherein at least some of the plurality of liners comprise tantalum nitride.

16. The integrated circuit of claim 1, wherein at least some of the plurality of liners comprise cobalt.

17. The integrated circuit of claim 1, wherein at least some of the plurality of liners comprise manganese.

18. The integrated circuit of claim 1, wherein at least some of the plurality of liners comprise a manganese oxide.

19. The integrated circuit of claim 1, wherein at least some of the plurality of liners comprise a manganese silicate.

* * * * *